United States Patent
Hung et al.

(10) Patent No.: US 11,553,587 B2
(45) Date of Patent: Jan. 10, 2023

(54) DISPLAY PANEL WITH INTERNAL TRACES PROOFED AGAINST ELECTROMAGENTIC INTERFERENCE

(71) Applicant: JADARD TECHNOLOGY INC., Shenzhen (CN)

(72) Inventors: Yi-Wei Hung, Shenzhen (CN); Gang Liu, Shenzhen (CN)

(73) Assignee: JADARD TECHNOLOGY INC., Shenzhen (CN)

(*) Notice: Subject to any disclaimer, the term of this patent is extended or adjusted under 35 U.S.C. 154(b) by 0 days.

(21) Appl. No.: 17/345,113

(22) Filed: Jun. 11, 2021

(65) Prior Publication Data
US 2022/0279645 A1  Sep. 1, 2022

(30) Foreign Application Priority Data
Mar. 1, 2021  (CN) .......................... 202110226633.4

(51) Int. Cl.
*H05K 1/02*  (2006.01)

(52) U.S. Cl.
CPC ........... *H05K 1/0228* (2013.01); *H05K 1/028* (2013.01); *H05K 2201/10128* (2013.01)

(58) Field of Classification Search
CPC .. H05K 1/0216; H05K 1/0228; H05K 1/0219; H05K 1/025; H05K 1/0253; H05K 1/0277; H05K 1/0278; H05K 1/028; H05K 1/14; H05K 1/141; H05K 1/147; H05K 1/148; H05K 2201/05; H05K 2201/0707; H05K 2201/0723; H05K 2201/0929; H05K 2201/093; H05K 2201/09309; H05K 2201/09318; H05K 2201/09327; H05K 2201/10128
See application file for complete search history.

(56) References Cited

U.S. PATENT DOCUMENTS

| | | | |
|---|---|---|---|
| 5,838,412 A * | 11/1998 | Ueda | G02F 1/13452 349/150 |
| 11,049,436 B1 | 6/2021 | Shin et al. | |
| 2003/0214229 A1* | 11/2003 | Holman | G09G 3/3611 445/24 |
| 2006/0125720 A1* | 6/2006 | Kim | H05K 7/20963 345/60 |
| 2017/0118838 A1* | 4/2017 | Williams | H05K 3/027 |
| 2020/0358195 A1* | 11/2020 | Wu | H01Q 1/48 |

FOREIGN PATENT DOCUMENTS

| | | |
|---|---|---|
| CN | 206470510 U | 9/2017 |
| CN | 113284413 A | 8/2021 |

* cited by examiner

*Primary Examiner* — Hoa C Nguyen
*Assistant Examiner* — John B Freal
(74) *Attorney, Agent, or Firm* — ScienBiziP, P.C.

(57) ABSTRACT

A display panel with display and non-display regions has pixel units in the display region. The non-display region defines a bonding region in which there are traces and driving chips. The driving chips are bonded in a flexible printed circuit, and electrically connect with the pixel units. The traces include high-speed signal traces, power traces, and grounding traces. The grounding traces are adjacent to the power traces and so disposed as to shield against electromagnetic interference affecting the signal and power traces, the grounding traces serving as reference ground to the power traces, and form a shield against electromagnetic interference.

10 Claims, 7 Drawing Sheets

DISPLAY PANEL WITH INTERNAL TRACES PROOFED AGAINST ELECTROMAGENTIC INTERFERENCE

FIELD OF THE INVENTION

The subject matter herein generally relates to display panels.

BACKGROUND

Display panels are widely used in electronic devices, such as notebooks, mobile phones, personal digital assistants (PDAs), digital cameras, and wearable devices, as user interfaces. The display panel defines a display region and a non-display region surrounding with the display region. In the non-display region, there are driving chips on an array substrate, such as a source driver, a gate driver, and a time controller. A flexible printed circuit (FPC) with several signal traces is used for transmitting signals between the driving chips and the array substrate. The FPC is bonded on the array substrate in a chip-on-flex (COF) manner. The signal traces can be different types, such as high-speed signal traces, low-speed signal traces, power traces, and so on. The adjacent high-speed signal trace may be seen as a reference trace by the power trace, which can cause fluctuations in the signals on the high-speed signal trace. Electromagnetic interference from external electronic devices can also affect the signals of the high-speed signal trace and the power trace, reducing display performance of the display panel.

There is room for improvement in the art.

BRIEF DESCRIPTION OF THE FIGURES

Implementations of the present disclosure will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The term "circuit" is defined as an integrated circuit (IC) with a plurality of electronic elements, such as capacitors, resistors, and the like.

The present disclosure provides a display panel with different types of signal traces laid out so as to cancel or reduce the effects of electromagnetic interference as between different types of signal traces.

Figure 1:
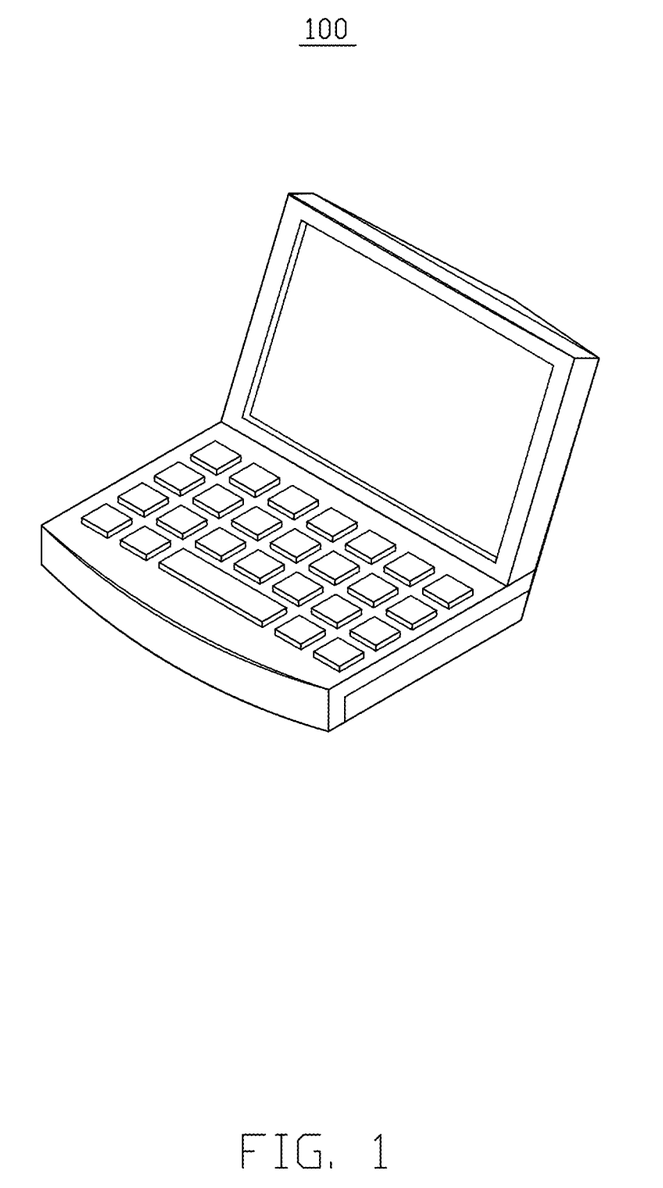
FIG. 1 is a diagram illustrating an embodiment of an electronic device with a display panel.
Figure 2:
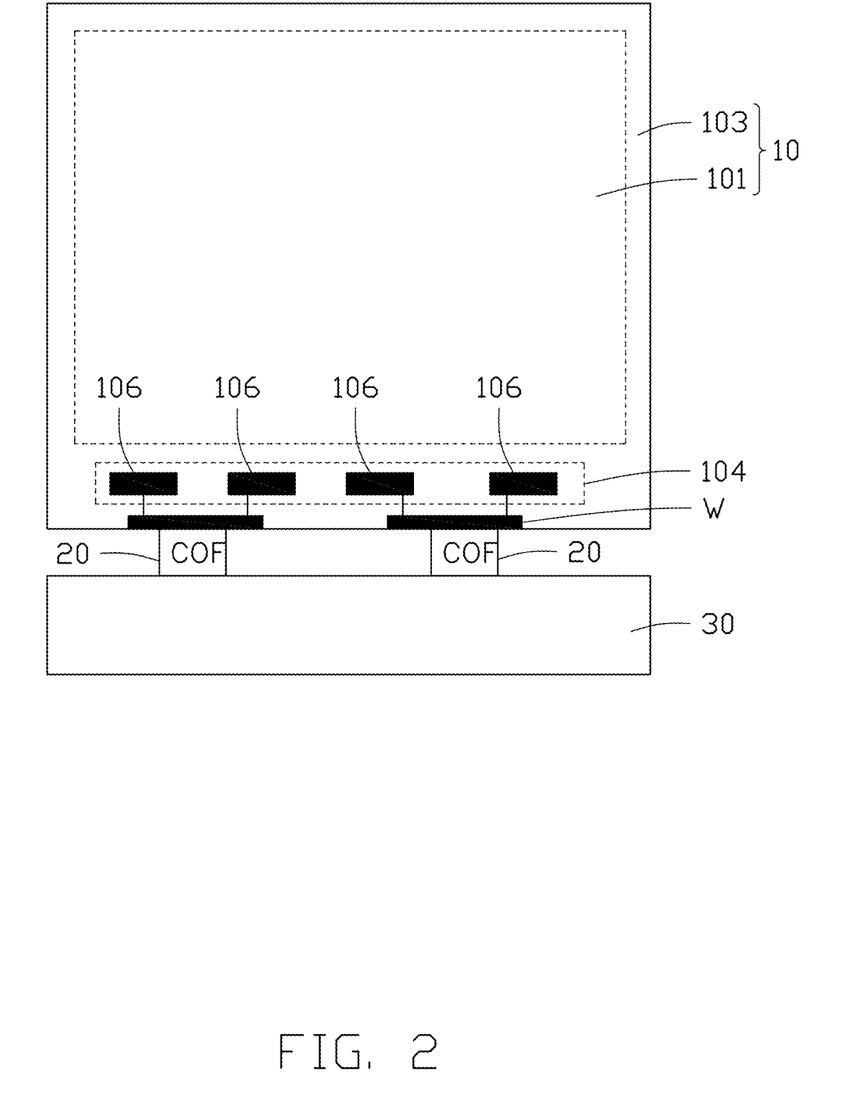
FIG. 2 is a diagram illustrating a bonding region of the display panel of FIG. 1.

FIG. 1 shows an embodiment of a display apparatus 100, and FIG. 2 shows an embodiment of a display panel 10 of the display apparatus 100. In one embodiment, the display apparatus 100 can be a notebook. In other embodiments, the display apparatus 100 also can be a mobile phone, a person digital assistant (PDA), a digital camera, or a wearable device, not being limited.

The display apparatus 100 further include a flexible printed board (FPC) 20 and a main circuit board 30. The display panel 10 connects with the main circuit board 30 through the FPC 20. The FPC 20 bonds a driving chip 106 on the display panel 10 in a Chip-on Flex (COF) manner.

The display panel 10 displays images. The display panel 10 defines a display region 101 and a non-display region 103 surrounding the display region 101. In one embodiment, in the display region 101, there are pixel units with light emitting elements (not shown), several scan lines (not shown), several data lines (not shown), and transistors (not shown), not being limited to these components. The non-display region 103 further defines a bonding region 104.

Figure 3:
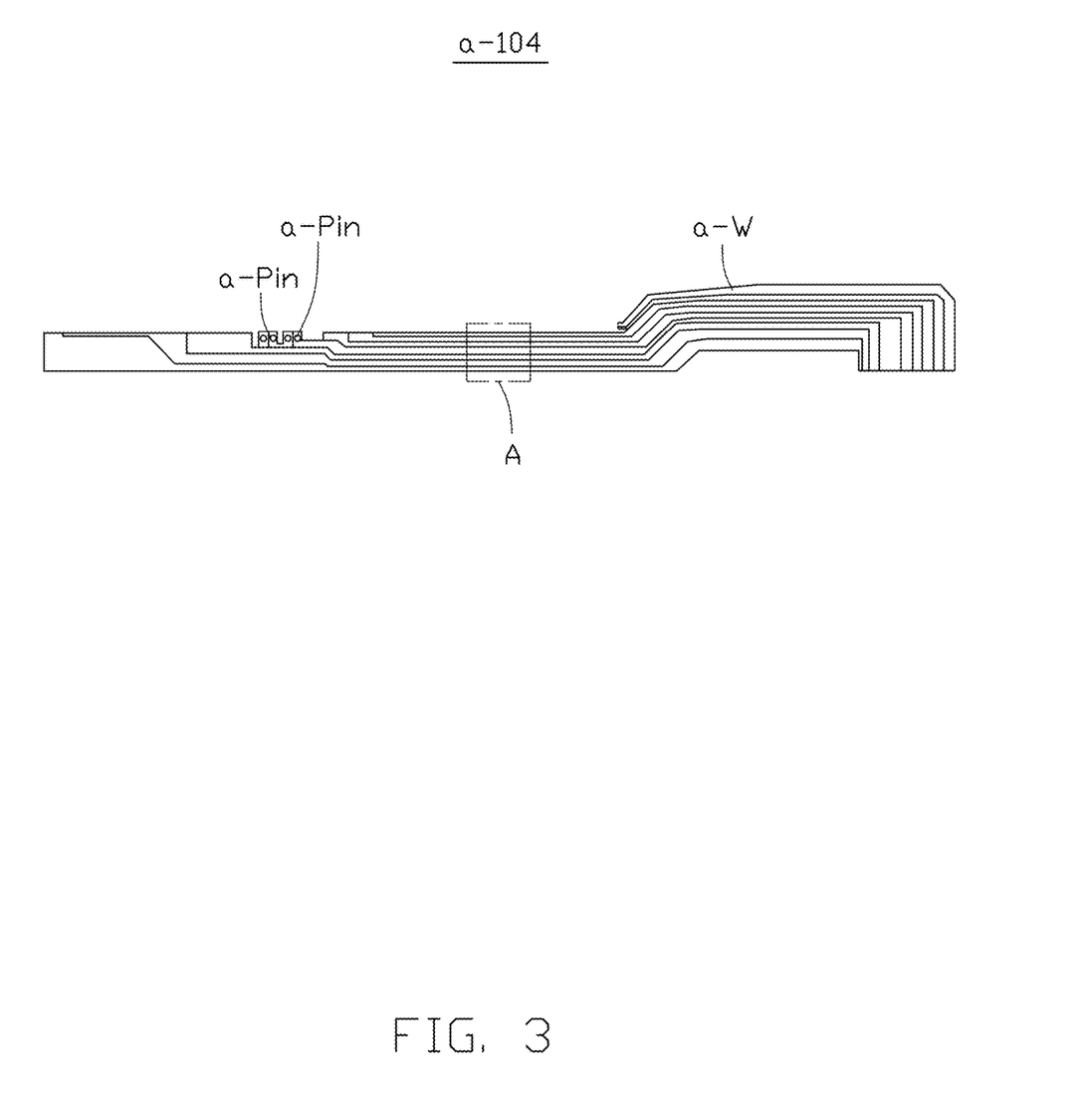
FIG. 3 is a circuit diagram illustrating the bonding region of FIG. 2 in a first embodiment.
Figure 4:
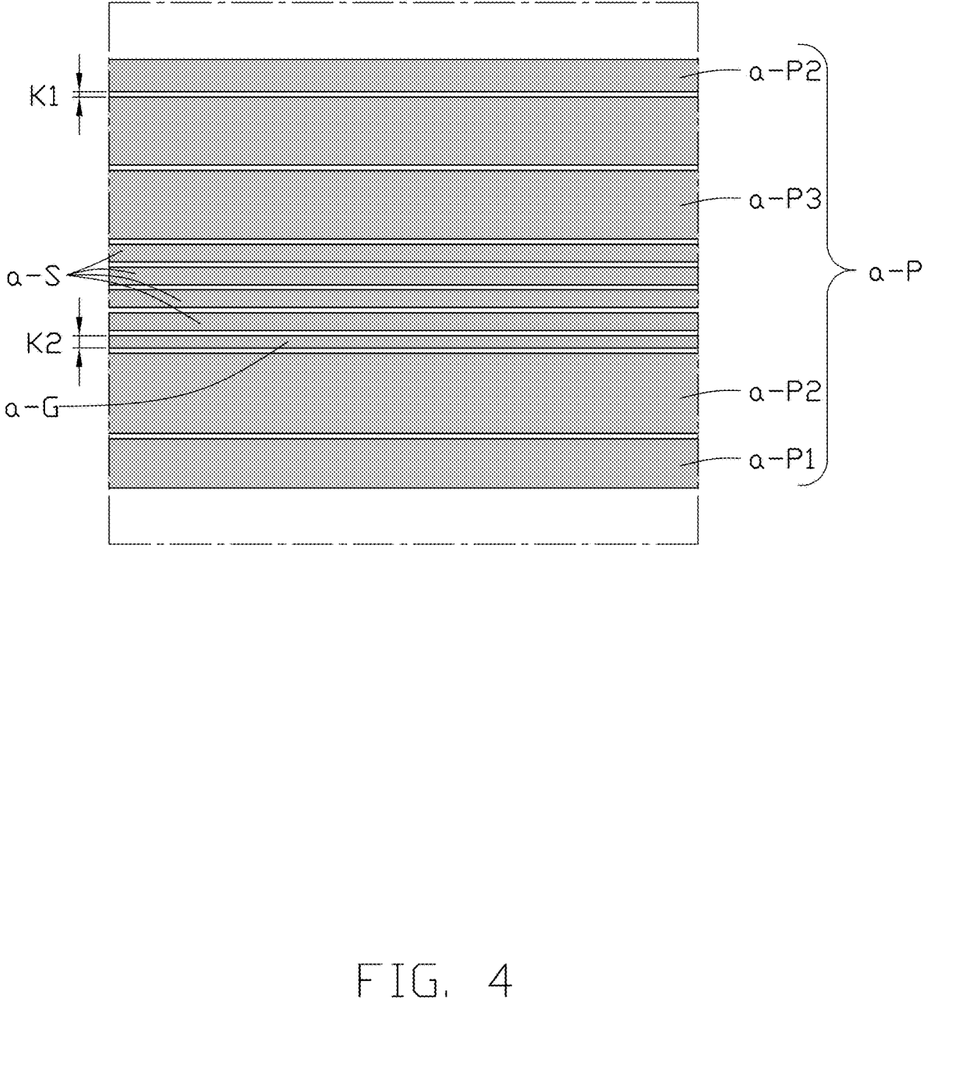
FIG. 4 is an enlarged view of region A of FIG. 3.

Referring to FIGS. 3 and 4, FIG. 3 shows bonding region 104 in a first embodiment (bonding region a-104), and FIG. 4 shows an area A (first region A) in the bonding region a-104. In the bonding region a-104, there are several traces a-W and several driving chips 106. The driving chips 106 are bonded on the FPC 20 in a COF manner, and electrically connect with the traces a-W for providing signals to the display region 101. In one embodiment, the driving chips 106 can be a source driving chip, a gate driving chip, or a time control chip.

The traces a-W include several power traces a-P, several high-speed signal traces a-S, and several connection pins a-Pin. The traces a-W are spaced from each other by a specified distance K1. In one embodiment, the specified distance K1 is 15 μm. The power traces a-P include at least one first power trace a-P1 with a first specified trace width, at least two second power traces a-P2 with a second specified trace width, and at least one third power trace a-P3 with a third specified trace width. The first power trace a-P1, the second power traces a-P2, and the third power trace a-P3 transmit different power voltages, and the first specified trace width, the second specified trace width, and the third specified trace width are different from each other. The first power trace a-P1 is disposed on an edge of the bonding region a-104 away from the display region 101. One second power trace a-P2 is disposed between the first power trace a-P1 and high-speed signal trace a-S, and a second power trace a-P2 is disposed on an edge of the bonding region a-104 adjacent to the display region 101, and adjacent to the third power trace a-P3. The third power trace a-P3 is disposed between the two second power traces a-P2. The high-speed signal traces a-S are disposed between the second power trace a-P2 adjacent to the first power trace a-P1 and the third power trace a-P3.

Figure 5:
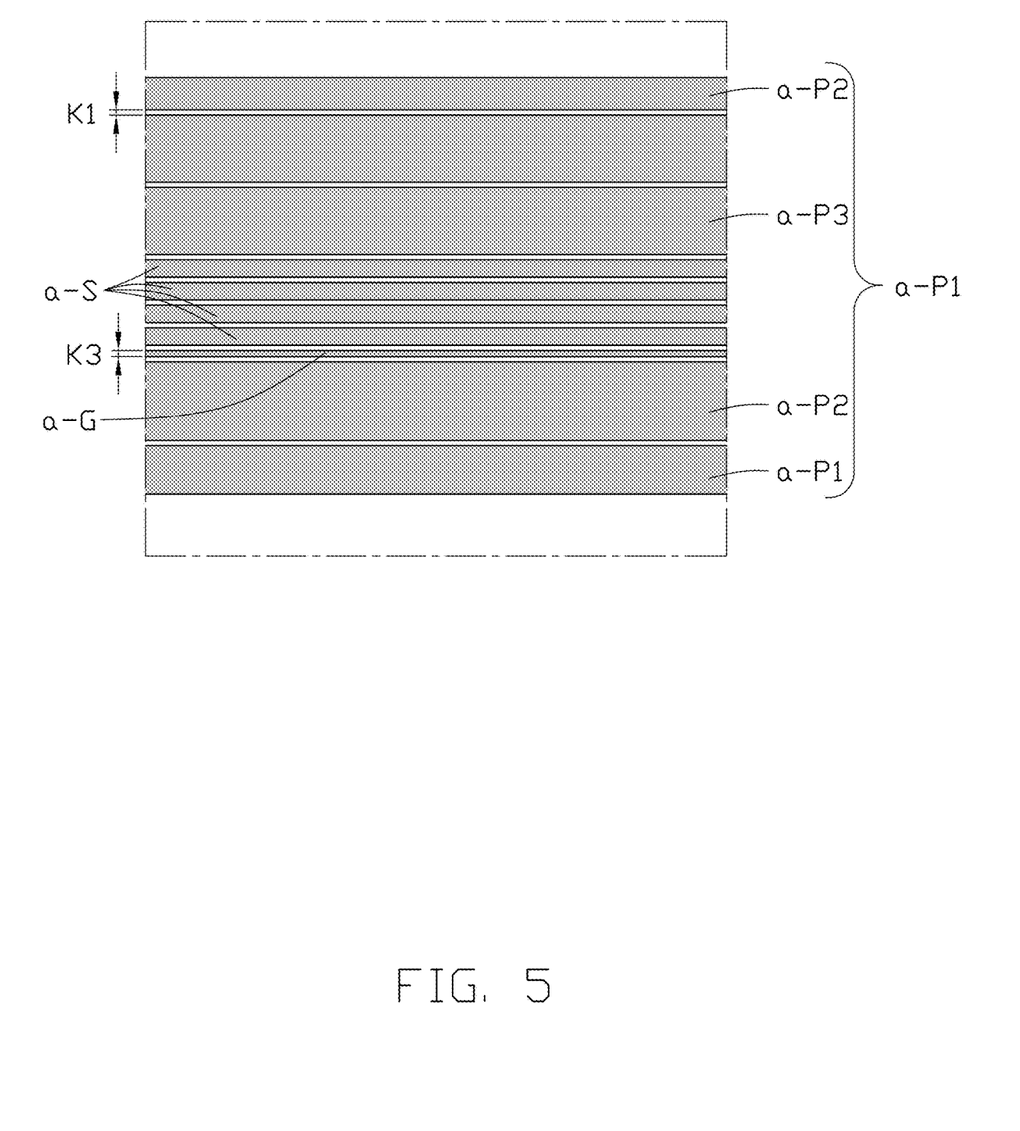
FIG. 5 is an enlarged view of signal traces in region A in a second embodiment.

Further, the traces a-W further includes several grounding traces a-G. The grounding traces a-G are adjacent to the power traces a-P, and serve as reference ground to the power traces a-P, to construct a loop. In respect of the power traces a-P and the high-speed signal traces a-S, the grounding traces a-G also serve as a shield against electromagnetic interference from adjacent electronic devices. In one embodiment, there are two grounding traces a-G. One of the grounding traces a-G is disposed between the second power trace a-P2 adjacent to the first power trace a-P1 and the high-speed signal trace a-S, and serves as the reference ground to the first power trace a-P1 and the second power trace a-P2. The other grounding trace a-G is disposed between the second power trace a-P2 adjacent to the display region 101 and the third power trace a-P3, and serves as the reference ground to the second power trace a-P2 and the third power trace a-P3. A width of the grounding trace a-G is in a range from 10 µm to 2.35 mm. In one embodiment, as shown in FIG. 4, the grounding traces a-G are in a first specified ground width K2, and the first specified ground width K2 is 10 µm. In other embodiment, as shown in FIG. 5, the grounding traces a-G are in a second specified ground width K3, and the second specified ground width K3 is 20 µm.

Figure 6:
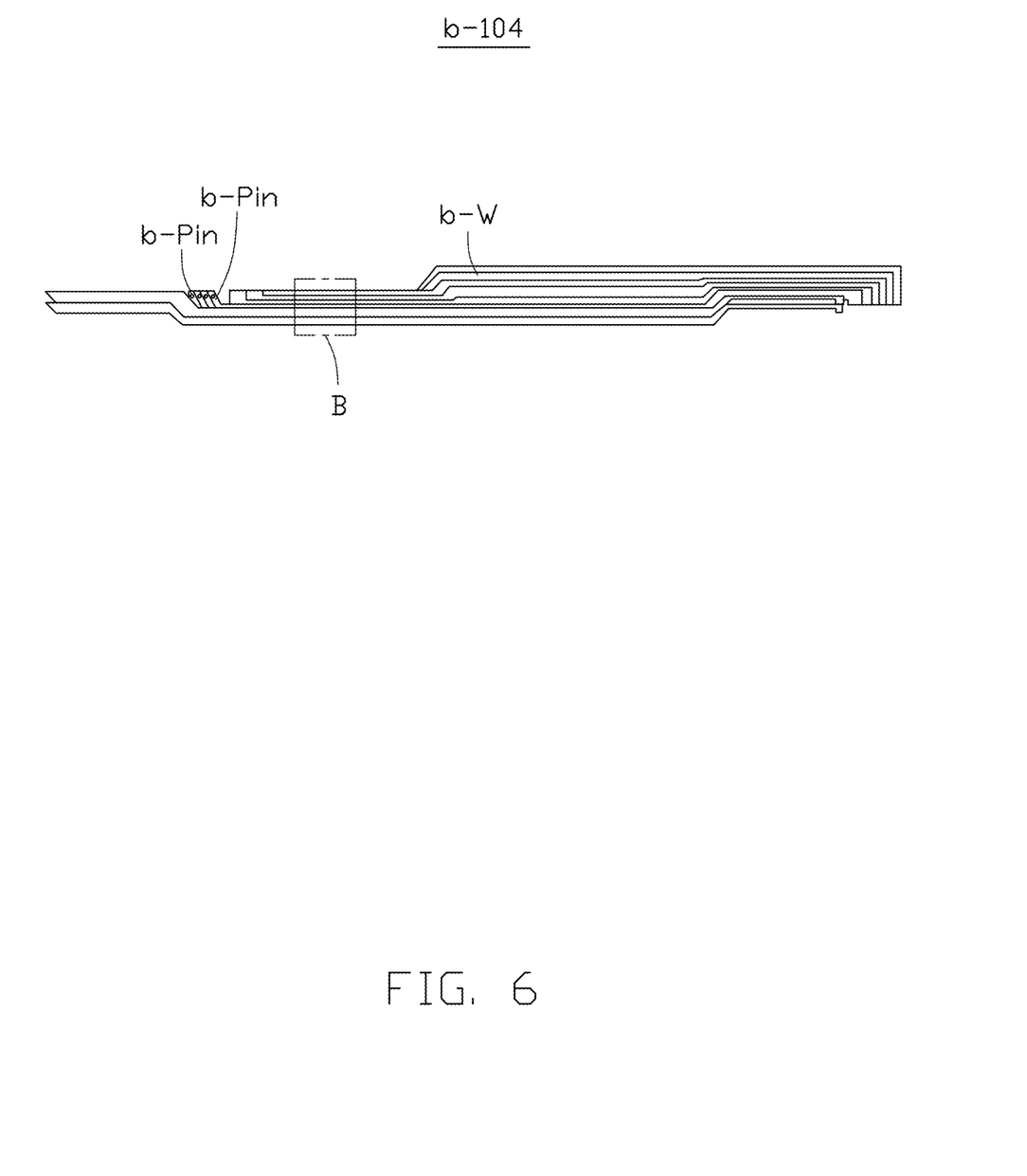
FIG. 6 is a circuit diagram of the bonding region of FIG. 2 in a second embodiment.
Figure 7:
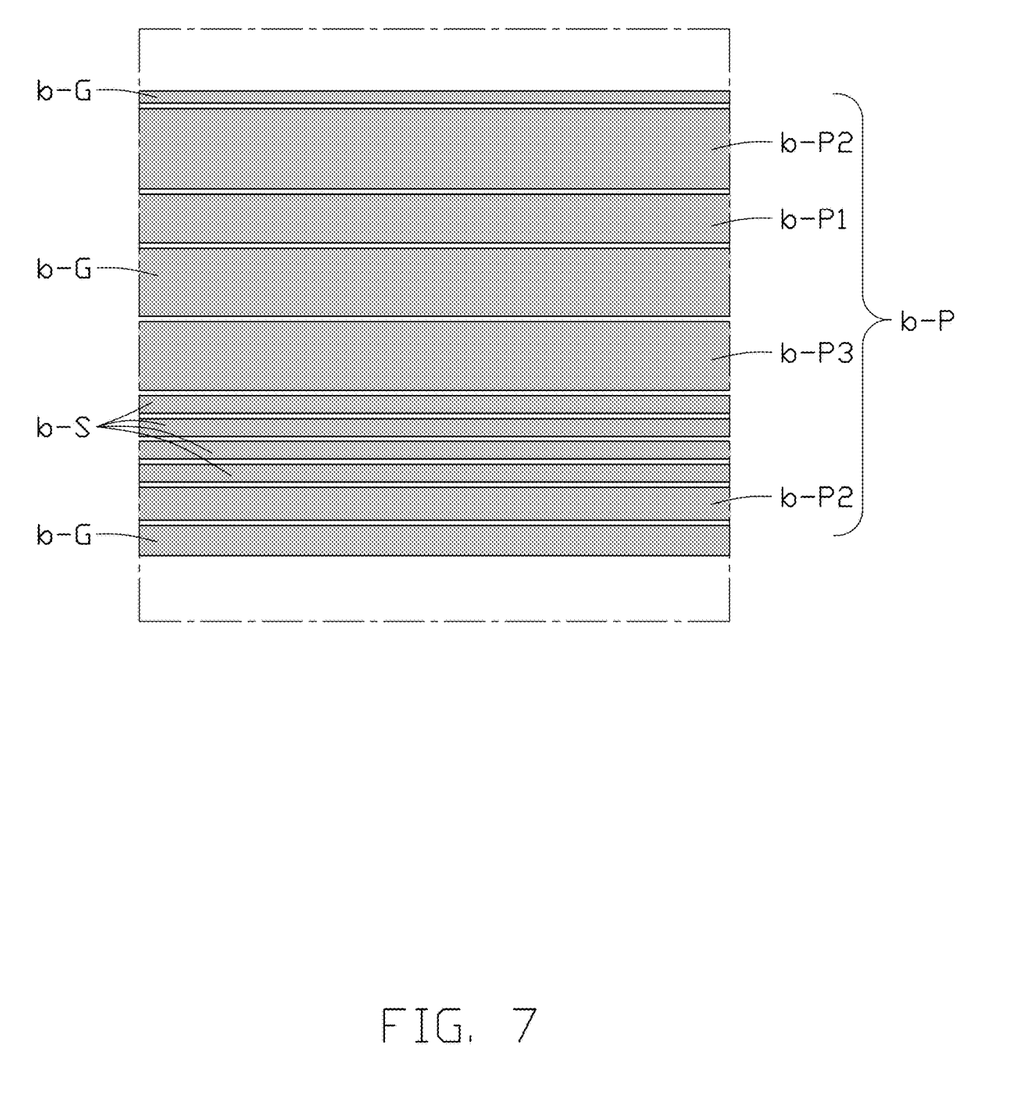
FIG. 7 is an enlarged view of region B of FIG. 6.

FIG. 6 shows a second embodiment of the bonding region 104 (bonding region b-104), and FIG. 7 shows an enlarged view of area B of FIG. 6 (second region B). In the bonding region b-104, there are several traces b-W and several driving chips 106. The driving chips 106 are bonded on the FPC 20 in the COF manner, and are electrically connected with the traces b-W. In one embodiment, the driving chip 106 can be a source driving chip, a gate driving chip, and a time controller, not being limited to these components.

The traces b-W include several power traces b-P, several high-speed signal traces b-S, and several connection pins b-Pin. The traces b-W are spaced from each other by a specified distance K1. In one embodiment, the specified distance K1 is 15 µm. The power traces b-P include at least one first power trace P1 with a first specified trace width, at least two second power trace b-P2 with a second specified trace width, and at least one third power trace b-P3 with a third specified trace width. The first power trace b-P1, the second power traces b-P2, and the third power trace b-P3 transmit different power voltages, and the first specified trace width, the second specified trace width, and the third specified trace width are different from each other. In one embodiment, the power traces b-W include a first power trace b-P1, two second power traces b-P2, and a third power trace b-P3. The second power traces b-P2 sandwich the first power trace b-P1, the third power trace b-P3, and the high-speed signal trace b-S. The high-speed signal traces b-S are disposed between the second power trace b-P2 away from the display region 101 and the third power trace b-P3. The first power trace b-P1 is disposed between the third power trace b-P3 and the second power trace b-P2 adjacent to the display region 101.

Further, the traces W further includes several grounding traces b-G The grounding traces b-G are adjacent to the power trace b-P, and serve as reference ground to the power trace b-P, to construct a loop. The grounding traces b-G also serve as a shield against electromagnetic interference by adjacent electronic devices. In one embodiment, there are three grounding traces b-G. One of the grounding traces b-G is disposed outside the second power trace b-P2 away from the display region 101, and serves as the reference ground to the second power trace b-P2 away from the display region 101. Another grounding trace b-G is disposed outside of the second power trace b-P2 adjacent to the display region 101 and the third power trace b-P3, and serves as the reference ground to the second power trace b-P2 adjacent to the display region 101. The third grounding trace b-G is disposed between the first power trace b-P1 and the third power trace b-P3, and serves as a reference ground to the first power trace b-P1 and the third power trace b-P3. A width of the grounding trace b-G is in a range from 10 µm to 2.35 mm.

The display panel 10 sets grounding traces b-G adjacent to power trace b-P, thus, the grounding traces b-G serve as reference ground to the power trace b-P for avoiding distortion of the high-speed signal traces b-S. The grounding traces b-G also serve as shields against electromagnetic interference from the external electronic devices, thus a display effect of the display panel 10 is improved. The grounding traces b-G are fundamental in establishing an electromagnetic induction with the electromagnetic fields from an external electronic device. The grounding width of the grounding traces b-G is 10 µm or 20 µm can reduce a frame width of the display panel 10.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A display panel, the display panel defines a display region and a non-display region; the non-display region defines a bonding region, the bonding region comprising:
    several traces; and
    driving chips bonded on a flexible printed circuit (FPC), and electrically connect to the traces;
    wherein the traces comprises high-speed signal traces, power traces, and grounding traces; the high-speed traces provide high-speed signal from the driving chip to the display region; the power traces provide power signal to the display panel; the grounding traces are disposed adjacent to the power traces; the grounding traces serve as reference grounds to the power traces, and form an electromagnetic shielding path; and
    wherein the power traces comprise a first power trace with a first specified width, a two second power traces with a second specified trace, and a third power trace with a third specified trace width, the high-speed signal trace is disposed between the second power trace adjacent to the first power trace and the third power trace.

2. The display panel of claim 1, wherein the first, second, and third specified widths of the first, second and third traces, respectively, are each different from the other.

3. The display panel of claim 2, wherein there are two grounding traces; one of the second power trace is disposed between the first power trace and the high-speed signal traces, and another second power trace is disposed on an edge of the bonding region adjacent to the display region, and is adjacent to the third power trace; the high-speed signal traces are disposed between the second power trace adjacent to the first power trace and the third power trace; one of the grounding traces is disposed between the second power trace adjacent to the first power trace and the high-speed signal trace, and serves as the reference ground to the first power trace and the second power trace; the other grounding trace is disposed between the second power trace adjacent to the display region and the third power trace, and serves as the reference ground to the second power trace and the third power trace.

4. The display panel of claim 3, wherein the first power trace is disposed on an edge of the bonding region away from the display region.

5. The display panel of claim 2, wherein there are three grounding traces; the two second power traces sandwiches the first power trace, the third power trace, and the high-speed signal trace; one of the grounding traces is disposed outside the second power trace away from the display region, and serves as the reference ground to the second power trace away from the display region; one of the three grounding traces is disposed outside of the second power trace adjacent to the display region and the third power trace, and serves as the reference ground to the second power trace adjacent to the display region; one of the three grounding traces is disposed between the first power trace and the third power trace, and serves as a reference ground to the first power trace and the third power trace.

6. The display panel of claim 5, wherein the first power trace is sandwiched between the third power trace and the second power trace adjacent to the display region.

7. The display panel of claim 1, wherein the traces are spaced from each other in a specified distance; the specified distance is 15 μm.

8. The display panel of claim 1, wherein a range of the width of the grounding trace is from 10 μm to 2.35 mm.

9. The display panel of claim 1, wherein the width of the grounding trace is 20 μm.

10. The display panel of claim 1, wherein the width of the grounding trace is 10 μm.

* * * * *